United States Patent
Machiyama

(10) Patent No.: US 7,406,360 B2
(45) Date of Patent: Jul. 29, 2008

(54) METHOD FOR DETECTING TRANSFER SHIFT OF TRANSFER MECHANISM AND SEMICONDUCTOR PROCESSING EQUIPMENT

(75) Inventor: Wataru Machiyama, Kai (JP)

(73) Assignee: Tokyo Elctron Limited, Tokyo (JP)

( * ) Notice: Subject to any disclaimer, the term of this patent is extended or adjusted under 35 U.S.C. 154(b) by 132 days.

(21) Appl. No.: 10/591,875

(22) PCT Filed: Feb. 22, 2005

(86) PCT No.: PCT/JP2005/002817

§ 371 (c)(1),
(2), (4) Date: Sep. 7, 2006

(87) PCT Pub. No.: WO2005/091355

PCT Pub. Date: Sep. 29, 2005

(65) Prior Publication Data

US 2007/0276533 A1 Nov. 29, 2007

(30) Foreign Application Priority Data

Mar. 18, 2004 (JP) ............................. 2004-077367

(51) Int. Cl.
*G06F 19/00* (2006.01)
*G06F 7/00* (2006.01)
*G05B 19/18* (2006.01)
*G05D 1/02* (2006.01)
*G05D 1/10* (2006.01)
*B65G 25/00* (2006.01)
*B66C 17/08* (2006.01)

(52) U.S. Cl. .................. 700/112; 700/114; 700/121; 700/229; 700/264; 700/302; 700/57; 414/153; 414/935

(58) Field of Classification Search .................. 700/29, 700/112, 114, 121, 213, 228, 229, 264, 302; 414/22.64, 150, 153, 241, 243, 253, 783, 414/935, 937; 438/183, 401; 439/148; 118/676, 118/695; 73/1.79
See application file for complete search history.

(56) References Cited

U.S. PATENT DOCUMENTS 5,740,034 A * 4/1998 Saeki .......................... 700/59

(Continued)

FOREIGN PATENT DOCUMENTS

JP 9-252039 9/1997

(Continued)

*Primary Examiner*—Crystal Barnes-Bullock
(74) *Attorney, Agent, or Firm*—Oblon, Spivak, McClelland, Maier & Neustadt, P.C.

(57) ABSTRACT

A dummy substrate (17) differs from a substrate to be processed in having a first guide (G1) for assisting centering, however, it can be handled as a substitute of the substrate to be processed. In a process chamber (2), a second guide (G2) is arranged to assist the dummy substrate (17) to center. To detect a transfer shift of a transfer mechanism (TRM), at first, the dummy substrate (17) is centered to a placing table (14) on the placing table (14) or at an upper position thereof by engagement of the first and the second guides (G1, G2). The dummy substrate (17) centered in such a manner is received by the transfer mechanism (TRM) and transferred to a detector (11). Then, a detection value of a decentering quantity and that in a decentering direction of the dummy substrate (17) are obtained by the detector (11), and a transfer shift of the transfer mechanism (TRM) is obtained based on the detection values.

20 Claims, 2 Drawing Sheets

U.S. PATENT DOCUMENTS

| | | | |
|---|---|---|---|
| 6,203,617 B1 * | 3/2001 | Tanoue et al. | 118/695 |
| 6,257,045 B1 * | 7/2001 | Hosokawa et al. | 73/1.79 |
| 6,400,445 B2 * | 6/2002 | Nishi et al. | 355/72 |
| 6,592,673 B2 * | 7/2003 | Welch et al. | 118/676 |
| 6,697,145 B1 * | 2/2004 | Aoyama | 355/53 |
| 6,742,980 B2 * | 6/2004 | Sasaki | 414/783 |
| 6,950,721 B2 * | 9/2005 | Tashiro et al. | 700/213 |
| 7,129,147 B2 * | 10/2006 | Kumagai et al. | 438/401 |
| 2004/0043513 A1 * | 3/2004 | Ishizawa et al. | 438/1 |
| 2004/0144492 A1 | 7/2004 | Ikeda et al. | |
| 2004/0230341 A1 * | 11/2004 | Suh et al. | 700/264 |

FOREIGN PATENT DOCUMENTS

| | | |
|---|---|---|
| JP | 10-163298 | 6/1998 |
| JP | 11-54591 | 2/1999 |
| JP | 11-345867 | 12/1999 |
| JP | 2003-78266 | 3/2003 |
| KR | 10-2004-0007626 | 1/2004 |

* cited by examiner

METHOD FOR DETECTING TRANSFER SHIFT OF TRANSFER MECHANISM AND SEMICONDUCTOR PROCESSING EQUIPMENT

FIELD OF THE INVENTION

The present invention relates to a method for detecting a transfer shift of a transfer mechanism by employing a dummy substrate as a substitute for a substrate to be processed in a semiconductor processing equipment and a semiconductor processing equipment configured to perform the method. The term "semiconductor processing" used herein denotes various processes required to manufacture a semiconductor device or a structure, which includes wiring, electrode and the like connected to the semiconductor device, on a substrate to be processed by forming a semiconductor layer, an insulating layer, a conductive layer and the like in a predetermined pattern on the substrate to be processed, e.g., a semiconductor wafer or a glass substrate for a LCD (liquid crystal display) or a FPD (flat panel display).

BACKGROUND OF THE INVENTION

In order to manufacture a semiconductor device, various processes such as a film forming process, an etching process, an oxidation process, a diffusion process, an annealing process, a quality modification process and the like are performed on a semiconductor wafer serving as a substrate to be processed. It is required in these processes to improve a throughput and a production yield along with a trend of a miniaturized and highly integrated semiconductor device. In view of the above, there is known a multi-chamber type semiconductor processing equipment capable of successively performing various processes without exposing a wafer to the atmosphere by coupling a plurality of processing chambers for performing a same process or different type processes to one another via a common transfer chamber.

A semiconductor processing equipment of such type has a transfer mechanism including a multi-joint arm transfer robot disposed in the transfer chamber. The transfer mechanism is used for transferring a semiconductor wafer serving as a substrate to be processed between a processing chamber and a receiving vessel (e.g., a receiving vessel having a lid, which is called a FOUP (Front Opening Unified Pod)) for accommodating therein a plurality of wafers in multi-levels. Before the transfer mechanism is used, a so-called teaching operation is performed by a control unit such as a computer or the like for controlling the transfer mechanism. By performing the teaching operation, important positions, e.g., a position for exchanging a wafer and the like, are stored in the control unit as position coordinates.

In order to improve processing uniformity, the transfer mechanism is required to transfer the wafer to the processing chamber with high accuracy. Accordingly, the high accuracy is required in the teaching operation as well as in repetition accuracy of the transfer mechanism and correction function for the transfer shift of the wafer. Along with such requirement, an automatic teaching system using a sensor is being practically used to cope with the limit of the teaching operation using the naked eye. As for the related art, Japanese Patent Laid-open Application No. 2000-127069 discloses therein a method for aligning a transfer position of a transfer system.

SUMMARY OF THE INVENTION

It is, therefore, an object of the present invention to provide a method and a semiconductor processing equipment for detecting a transfer shift of a transfer mechanism to thereby reduce an unnecessary downtime of the equipment during a teaching operation, for example.

In accordance with one aspect of the invention, there is provided a method for detecting a transfer shift of a transfer mechanism in a semiconductor processing equipment by using a dummy substrate different from a substrate to be processed in having a first guide for assisting a centering thereof, the dummy substrate serving as a substitute for the substrate to be processed, the equipment including:

a processing chamber for performing a processing on the substrate to be processed;

a placing table provided in the processing chamber, for mounting thereon the substrate to be processed during the processing;

the transfer mechanism provided at an outside of the processing chamber, for transferring the substrate to be processed on the placing table;

a detector provided at the outside of the processing chamber, for detecting an eccentricity and an eccentric direction of the substrate to be processed; and a second guide for assisting the centering of the dummy substrate, the second guide centering the dummy substrate by being engaged with the first guide with respect to the placing table while the dummy substrate is transferred onto the placing table by the transfer mechanism, the method including the steps of:

centering the dummy substrate with respect to the placing table by an engagement between the first and the second guides on or above the placing table;

receiving and transferring the centered dummy substrate to the detector by using the transfer mechanism; and attaining detection values of an eccentricity and an eccentric direction of the dummy substrate by using the detector and then obtaining the transfer shift of the transfer mechanism based on the detection values.

In accordance with another aspect of the invention, there is provided a semiconductor processing equipment for detecting a transfer shift of a transfer mechanism by using a dummy substrate different from a substrate to be processed in having a first guide for assisting a centering thereof, the dummy substrate serving as a substitute for the substrate to be processed, the equipment including:

a processing chamber for performing a processing on the substrate to be processed;

a placing table provided in the processing chamber, for mounting thereon the substrate to be processed during the processing;

the transfer mechanism provided at an outside of the processing chamber, for transferring the substrate to be processed on the placing table;

a detector provided at the outside of the processing chamber, for detecting an eccentricity and an eccentric direction of the substrate to be processed;

a second guide for assisting the centering of the dummy substrate, the second guide centering the dummy substrate with respect to the placing table by being engaged with the first guide while the dummy substrate is transferred onto the placing table by the transfer mechanism; and a control unit for controlling an operation of the equipment, wherein the control unit performs the steps of:

centering the dummy substrate with respect to the placing table by an engagement between the first and the second guides on or above the placing table;

receiving and transferring the centered dummy substrate to the detector by using the transfer mechanism; and attaining detection values of an eccentricity and an eccentric direction of the dummy substrate by using the detector and then obtaining the transfer shift of the transfer mechanism based on the detection values.

DETAILED DESCRIPTION OF THE PREFERRED EMBODIMENT

The inventor of the present invention has studied a transfer shift in a conventional semiconductor processing equipment during a development of the present invention. As a result, the inventor obtained a conclusion to be described hereinafter.

Figure 5:
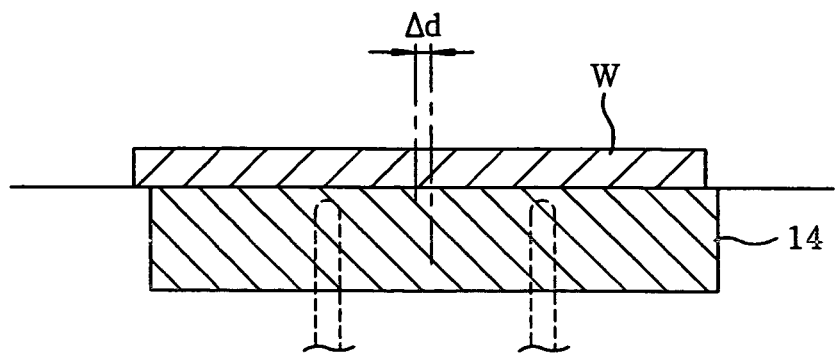
FIG. 5 represents a cross sectional view showing a transfer shift in a processing chamber of a conventional semiconductor processing equipment.

FIG. 5 is a cross sectional view illustrating a transfer shift in a processing chamber of a conventional semiconductor processing equipment. In this example, there is shown a state where a transfer shift (center shift) Δd has occurred on a wafer W mounted on a placing table 14 in a processing chamber 2 by an operation error of a transfer mechanism. In general, during the operation of the semiconductor processing equipment, it is difficult to check an inside of the processing chamber. Accordingly, when a trouble has occurred, it is difficult to determine whether the trouble is caused by the transfer shift or not. The occurrence of the trouble can be detected by an abnormal signal from, e.g., an electrostatic chuck, for fixing a wafer, provided on the placing table in the processing chamber. However, such transfer shift shown in FIG. 5 may not be detected by the signal from the electrostatic chuck.

In such a case, the trouble is checked with the naked eye by opening the processing chamber, only after the occurrence of trouble in the processing equipment. At that moment, it can be possible to determine whether it was caused by the transfer shift or not. In case the processing chamber is a vacuum processing chamber, whenever the cause of the trouble needs to be checked, the processing chamber needs to be opened to the atmosphere to inspect and remedy the cause of the trouble, and then restored to vacuum. Therefore, the processing equipment has to be stopped for a long period of time, causing a big downtime problem.

Hereinafter, embodiments of the present invention conceived from the above consideration will be described with reference to the accompanying drawings. Further, like reference numerals will be given to like parts having substantially the same functions, and a redundant description thereof will be provided only when necessary.

Figure 1:
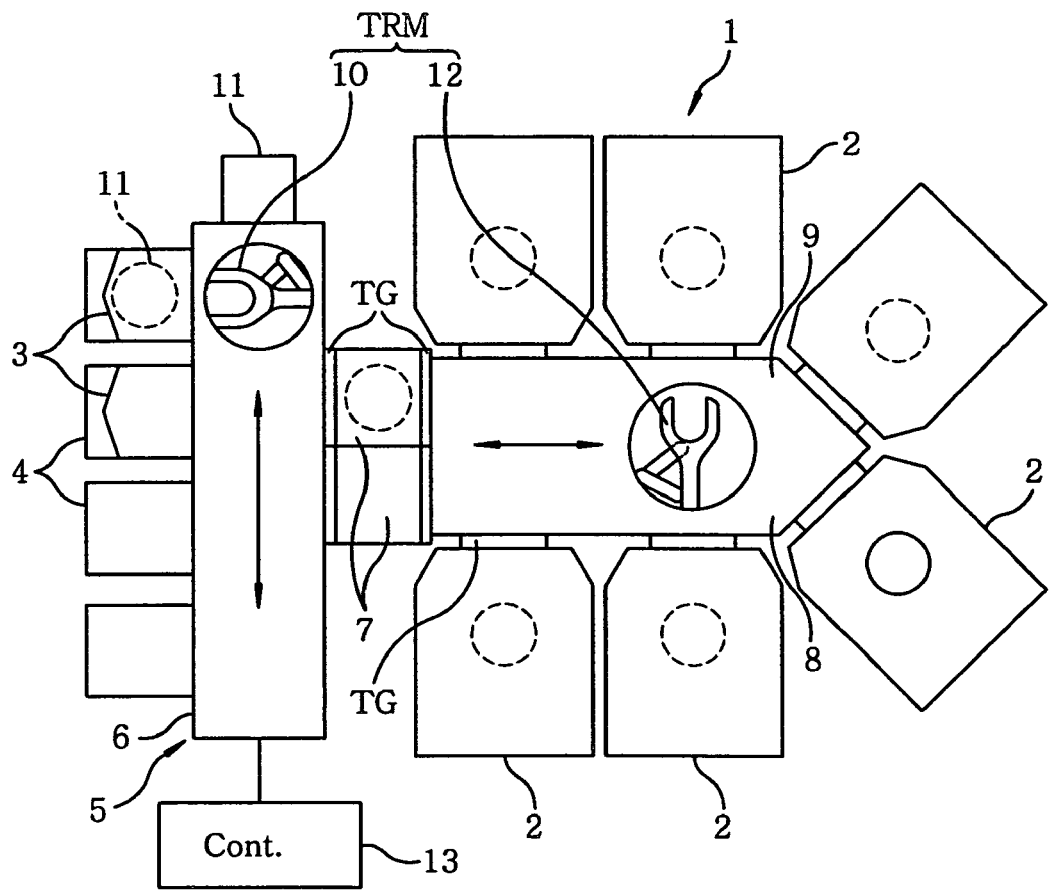
FIG. 1 shows a schematic plan view of a semiconductor processing equipment in accordance with an embodiment of the present invention.

FIG. 1 shows a schematic plan view of a semiconductor processing equipment in accordance with an embodiment of the present invention. A processing equipment 1 is of a cluster tool type (multi-chamber type) in which six processing chambers 2, each for processing a single semiconductor wafer W, are connected to a periphery of a common transfer chamber 9. Those processing chambers 2 enable to perform a series of processes on a substrate to be processed, e.g., a semiconductor wafer W.

To be specific, the processing equipment 1 has a normal pressure transfer system 5 for transferring a wafer W unloaded from a receiving vessel 3 (e.g., a receiving vessel having a lid, which is called a FOUP) mounted on a loading port 4 under the atmospheric pressure. Further, the processing equipment 1 has a vacuum transfer system 8, which is connected to a transfer chamber 6 of the normal pressure transfer system 5 via load-lock chambers 7, for transferring the wafer W under the specific depressurized atmosphere. Moreover, a plurality of vacuum processing chambers 2, each for performing a specific process, e.g., a CVD process or the like, on a single wafer W accommodated therein under the specific gas atmosphere, are connected to a periphery of a common transfer chamber (vacuum transfer chamber) 9 of the vacuum transfer system 8.

Provided in the transfer chamber 6 of the normal pressure transfer system 5 is a multi-joint arm transfer robot 10 for transferring the wafer W between the loading port 4 and the load-lock chamber 7. The transfer chamber 6 is elongated in one direction and, also, the multi-joint arm type transfer robot 10 is disposed such that it can move in a length direction of the transfer chamber 6. One side of the transfer chamber 6 is connected to a plurality of loading ports 4, whereas another side thereof is connected to one ends of the load-lock chambers 7 via gate valves TG.

Installed in the transfer chamber 9 of the vacuum transfer system 8 is a multi-joint arm transfer robot 12 for transferring the wafer W between the load-lock chambers 7 and the processing chamber 2. The transfer chamber 9 is elongated in one direction and, also, the multi-joint arm transfer robot 12 is disposed such that it can move in a length direction of the transfer chamber 9. One end of the transfer chamber 9 is connected to other ends of the load-lock chambers 7 via the gate valves TG. The load-lock chambers 7, the transfer chamber 9 and the processing chambers 2 are connected to a vacuum exhaust system capable of controlling inner spaces thereof at a specific pressure. Although two load-lock chambers 7 are arranged side by side in this example, a single load-lock chamber 7 can be installed.

An orienter (detector or aligner) 11 for aligning the wafer W is provided at one end of the transfer chamber 6. The orienter 11 has a known configuration including a rotation reference table (not shown) for mounting thereon the wafer W and an optical sensor (not shown) disposed near the rotation reference table. The optical sensor optically detects a peripheral region of the wafer W while the wafer W is rotating. Then, a detection signal is transferred to an operation unit of a control unit 13. Responsive to the detection signal, the control unit 13 obtains an eccentricity, an eccentric direction and an orientation of the wafer W, i.e., a position of a notch and/or an orientation flat serving as a cutoff mark on the wafer W.

The transfer robots 10 and 12 are controlled by the control unit 13 for controlling an operation of the processing equipment 1. The transfer robot 10 is manipulated such that a positional shift of the wafer W can be corrected when the wafer W is received from the orienter 11. Such manipulation is carried out under the control of the control unit 13 based on the eccentricity, the eccentric direction and the orientation of the wafer W which are detected via the orienter 11.

A placing table 14 for mounting thereon the wafer W is provided in each of the processing chambers 2. Disposed at the placing table 14 are a plurality of, e.g., three, lifter pins 15 for assisting the transfer robot 12 in loading/unloading the wafer W with respect to the placing table 14. The lifter pins 15 vertically move through the placing table 14 by a driving mechanism (not shown) provided under the placing table 14. In other words, the lifter pins 15 move up and down while supporting the wafer W and then transfer the wafer W between themselves and the transfer robot 12.

As described above, the processing equipment 1 is provided with a transfer mechanism (TRM) including two transfer robots 10 and 12 for transferring wafers W between the receiving vessels 3 and the processing chambers 2. An effect of the transfer shift of the transfer robot 10 of the normal pressure transfer system on the transfer of the wafer W is extremely small compared with that of the transfer robot 12 of the vacuum transfer system. Accordingly, the transfer shift of the transfer robot 10 of the normal pressure transfer system can be ignored. Hereinafter, the reason thereof will be explained.

For example, let's assume that the transfer robot 10 of the normal pressure transfer system deviates to a left side by 1 mm while extending a transfer arm. When the transfer robot 10 moves toward the receiving vessel 3 to take the wafer W in such a case, the transfer arm is extended in a state where a center of a hand of the transfer arm is deviates to the left side by 1 mm with respect to the center of the wafer W. If the wafer W is received by the hand of the transfer arm in such a state, the wafer W is loaded onto a position deviated to a right side by 1 mm with respect to the center of the hand. After performing sliding and revolutional motions, the transfer robot 10 extends the transfer arm toward a stage of the orienter 11 with an extension/contraction operation. At this time, the transfer arm extends in a state where the center of the hand of the transfer arm deviates to the left side by 1 mm with respect to a center of the stage of the orienter 11. Consequently, the wafer W loaded at the right side by 1 mm with respect to the center of the hand is positioned at the center of the stage of the orienter 11.

In other words, even if the transfer shift of the transfer robot 10 occurs, the wafer W transferred from the receiving vessel 3 to the orienter 11 is not affected by the transfer shift. Similarly, the wafer W transferred from the orienter 11 to a load-lock chamber 7 is not affected by the transfer shift of the transfer robot 10. Therefore, the transfer shift of the transfer robot 10 of the normal pressure transfer system can be considered to be zero.

On the other hand, the vacuum transfer system 8 suffers from the effects of displacement of a processing chamber 2 caused by regular maintenance accompanied by disassembly and cleaning, deformation of a processing chamber 2 caused by the vacuum pressure and the like. Accordingly, even if the transfer robot 12 transfers the wafer W to a same location in the processing chamber 2, the wafer W may often deviates from a specific mounting position on the placing table 14. Therefore, in terms of the entire transfer mechanism (TRM) including the two transfer robots 10 and 12, the transfer shift is caused by various reasons. In this connection, the wafer W is accurately positioned on a specific mounting position on the placing table 14 by detecting the transfer shift of the transfer mechanism (TRM) as will be described in embodiments below.

Figure 2:
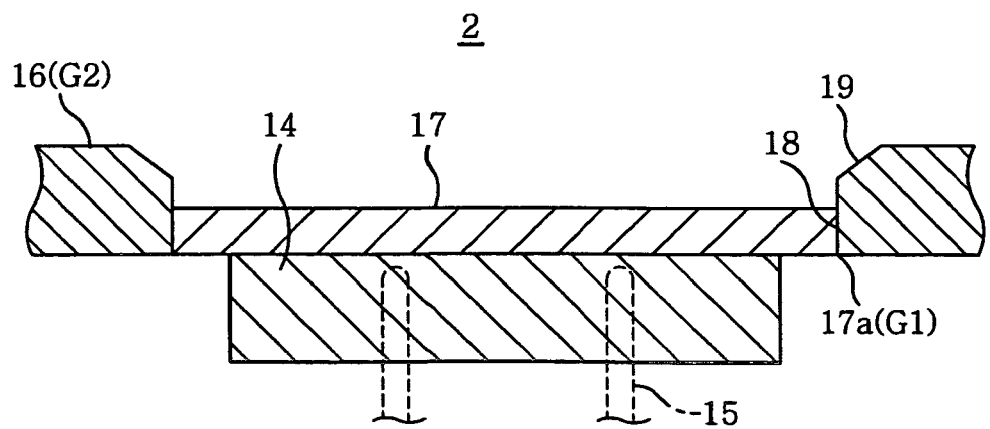
FIG. 2 describes a cross sectional view of a mechanism for centering a dummy substrate in accordance with a first embodiment of the present invention, the mechanism being installed in a processing chamber of the equipment shown in FIG. 1.
Figure 3:
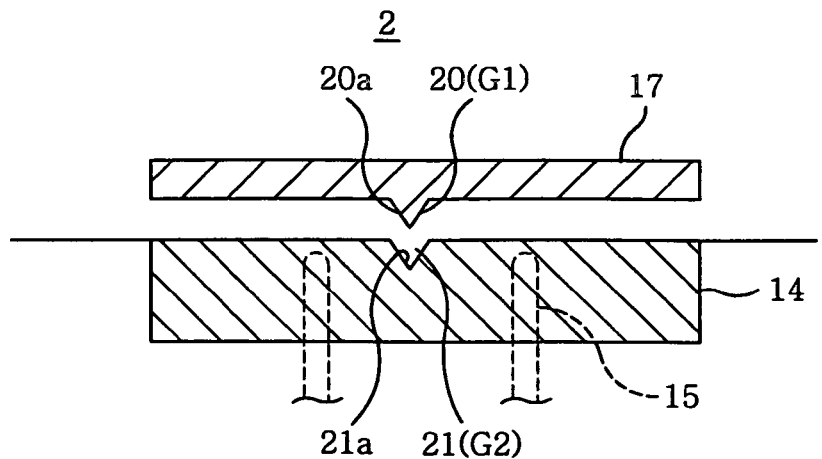
FIG. 3 provides a cross sectional view of a mechanism for centering a dummy substrate in accordance with a second embodiment of the present invention, the mechanism being installed in the processing chamber of the equipment illustrated in FIG. 1.
Figure 4:
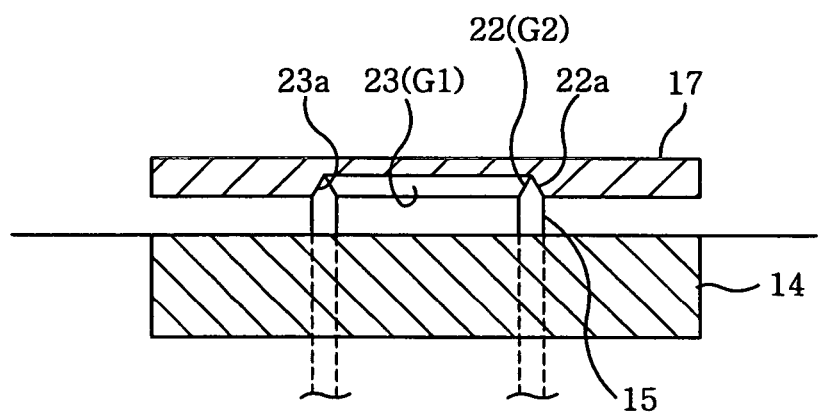
FIG. 4 presents a cross sectional view of a mechanism for centering a dummy substrate in accordance with a third embodiment of the present invention, the mechanism being installed in the processing chamber of the equipment depicted in FIG. 1.

FIGS. 2 to 4 describe cross sectional views of mechanisms for centering a dummy substrate in accordance with the embodiments of the present invention, the mechanisms being installed in the processing chamber of the equipment shown in FIG. 1. In each of the embodiments, in order to obtain the transfer shift of the transfer mechanism (TRM), a dummy wafer (dummy substrate) 17 is used as a substitute for the wafer W serving as a substrate to be processed. Although the dummy wafer 17 is different from the wafer W in having a first guide G1 for assisting a centering thereof, the dummy wafer is manufactured such that it can replace the wafer W for product. In the meantime, a second guide G2 for assisting a centering of the dummy wafer 17 is provided in the processing chamber 2 of the processing equipment 1. While the dummy wafer 17 is transferred from the transfer mechanism (TRM) to the placing table 14, the second guide G2 serves to center the dummy wafer 17 with respect to the placing table 14 by being engaged with the first guide G1.

In order to obtain the transfer shift of the transfer mechanism (TRM), the control unit 13 for controlling the operation of the processing equipment 1 performs following processes. First of all, the dummy wafer 17 is centered with respect to the placing table 14 on or above the placing table 14 by the engagement of the first and the second guides G1 and G2. Then, the transfer mechanism (TRM) receives and transfers the centered dummy wafer 17 to the orienter 11. Next, the orienter 11 attains an eccentricity and an eccentric direction of the dummy wafer 17, thereby obtaining the transfer shift of the transfer mechanism (TRM) based on the detection values.

Preferably, the control unit 13 transfers the dummy wafer 17 to the orienter 11 before the dummy wafer 17 is centered with respect to the placing table 14; and, then, detects initial detection values of an initial eccentricity and an initial eccentric direction of the dummy wafer 17 via the orienter 11. Thereafter, when the dummy wafer 17 is transferred from the orienter 11 to a location on or above the placing table 14, the initial eccentricity and the initial eccentric direction are corrected based on the initial detection values. In general, the transfer mechanism (TRM) also performs the operation of transferring the dummy wafer 17 into the processing chamber 2 (i.e., the transferring operation of the dummy wafer 17 before being centered with respect to the placing table 14).

First Embodiment

FIG. 2 provides a cross sectional view of a mechanism for centering a dummy wafer in accordance with a first embodiment of the present invention. In the first embodiment, the dummy wafer (dummy substrate) 17 is a substrate having a diameter greater than that of the wafer W. Further, an outer peripheral region 17a forming an outline thereof serves as the first guide G1 for assisting a centering thereof. Meanwhile, a guide ring 16 provided in the processing chamber 2 to surround the placing table 14 serves as the second guide G2 for assisting the centering of the dummy wafer 17. The guide ring 16 has a slant surface (tapered surface) 19 formed at an upper edge thereof and a circular opening 18 having a lower portion thereof where the dummy wafer 17 is inserted.

As for the guide ring 16, a modified conventional focus ring can be employed, for example. A center of the opening 18 of the guide ring 16 coincides with that of the circular placing table 14 and thus also coincides with that of a specific mounting position of the wafer W. Moreover, the slant surface 19 provided above the opening 18 is gradually and coaxially enlarged in diameter upwardly. Accordingly, even if the transfer shift of the transfer mechanism (TRM) has occurred, the dummy wafer 17 is centered to a specific mounting position of the wafer W on the placing table 14 (hereinafter, it is simply referred to as it is centered with respect to the placing table 14) while the dummy wafer 17 delivered from the transfer mechanism (TRM) to the lifter pins 15 is being lowered.

In case the wafer W has a diameter of 300 mm, the dummy wafer 17 is set to have a slightly greater diameter, e.g., 302 mm. Further, the opening 18 of the guide ring 16 is formed to have a diameter of 302.2 mm, for example, so that the dummy wafer 17 can be precisely inserted thereinto. The dummy wafer 17 is preferably made of a same material of the wafer W or quartz.

In order to detect the transfer shift of the transfer mechanism (TRM), the dummy wafer 17 is centered by the guide ring 16 when it is mounted on the placing table 14 by the transfer mechanism (TRM). Next, the centered dummy wafer 17 is received and transferred by the transfer mechanism (TRM) to the orienter 11. Thereafter, detection values of an eccentricity and an eccentric direction of the dummy wafer 17 is obtained by the orienter 11 and the transfer shift of the transfer mechanism (TRM) is obtained based on the detection values.

More specifically, in this embodiment, the dummy wafer 17 accommodated in the receiving vessels 3, for example, is unloaded therefrom and then transferred to the orienter 11 by the transfer robot 10 of the normal pressure transfer system 5. Then, initial detection values of an initial eccentricity an initial eccentric direction of the dummy wafer 17 is attained via the orienter 11. Next, when the transfer robot 10 receives the dummy wafer 17 from the orienter 11, the initial eccentricity and the initial eccentric direction are corrected based on the initial detection values. Then, the dummy wafer 17 is transferred to a load-lock chambers 7 by the transfer robot 10.

Thereafter, the dummy wafer 17 is transferred from the load-lock chamber 7 into the processing chamber 2 by the transfer robot 12 and then mounted on the placing table 14 via the lifter pins 15. At this time, by engaging the outer peripheral region 17a of the dummy wafer 17 and the opening of the guide ring 16, i.e., the first guide G1 and the second guide G2, the dummy wafer 17 is centered with respect to the placing table 14. In other words, by inserting the dummy wafer 17 into the opening 18 of the guide ring 16, the center of the dummy wafer 17 coincides with that of the specific mounting position of the wafer W.

Thereafter, the centered dummy wafer 17 is lifted by the lifter pins 15 and then received and transferred into the load-lock chamber 7 by the transfer robot 12. Next, the transfer robot 10 transfers the dummy wafer 17 from the load-lock chamber 7 to the orienter 11. Then, the detection values of the eccentricity and the eccentric direction is attained by the orienter 11 and then the transfer shift of the transfer mechanism (TRM) is obtained based on the detection values. In other words, the control unit 13 obtains the amount and the direction of the transfer shift based on the detection values of the eccentricity and the eccentric direction. In case the eccentricity is zero, the transfer shift is not generated.

The control unit 13 stores such obtained transfer shift as information for correcting a teaching position; and controls the operation of the transfer mechanism (TRM) (normally the transfer robot 12) so that the transfer shift can be corrected. Consequently, the transfer shift of the transfer mechanism (TRM) can be checked without opening the transfer chamber 2, thereby enabling to perform a reteaching operation without correction (correction of teaching data). As a result, it is possible to reduce an unnecessary downtime, which is particularly effective in case the processing equipment is a vacuum processing equipment.

For example, in case the orienter 11 detects an eccentricity of 1 mm and an eccentric direction of 60°, such values would be the amount and the direction of the transfer shift of the wafer if the wafer is transferred as it is. Therefore, an access position of the transfer robot 12 of the vacuum transfer system 8 with respect to the processing chamber 2 is changed from the previous teaching position by 1 mm and 60°. In case the orienter 11 is provided at the atmospheric side (normal pressure side) as in this embodiment, the position is reversed when a wafer is transferred from the vacuum side transfer robot 12 to the atmospheric side transfer robot 10, so that the correction thereof needs to be made in consideration thereof.

The second guide G2 provided in the processing chamber 2 for assisting the centering of the dummy wafer 17, is formed of the guide ring 16 having a simple structure. That is, the guide ring 16 is disposed to surround the placing table 14 and has the opening 18 on which is provided the upwardly enlarging slant surface 19. An inner diameter of a lower portion of the opening 18 of the guide ring 16 is set to be substantially same as a diameter of the dummy wafer 17 (slightly greater than a diameter of the wafer W). Such structure can be obtained by modifying the conventional focus ring.

Furthermore, the guide ring 16 is made of the same material of the wafer W or quartz and thus can be free from unnecessary contamination. In this case, the dummy wafer 17 can be simply stored in the receiving vessel together with the wafer.

The control unit 13 detects the eccentricity and the eccentric direction of the dummy wafer 17 by using the orienter 11 and then corrects the transfer shift of the transfer mechanism (TRM) based on the detection values. Accordingly, it is possible to automatically correct the transfer shift of the transfer mechanism (TRM).

Second Embodiment

FIG. 3 provides a cross sectional view of a mechanism for centering a dummy substrate in accordance with a second embodiment of the present invention. In the second embodiment, a dummy wafer (dummy substrate) 17 is a substrate having the same diameter as that of the wafer W. Further, as a first guide G1 for assisting a centering of the dummy wafer 17, a protrusion 20 is formed on a bottom surface thereof. Meanwhile, as a second guide G2 for assisting the centering of the dummy wafer 17, a recess 21 to be engaged with the protrusion 20 of the dummy wafer 17 is formed on a top surface of the placing table 14 in the processing chamber 2.

The protrusion 20 is formed in a cone shape or a pyramid shape having a slant surface 20a as a side surface, and an apex thereof is positioned on a center of the dummy wafer 17. Meanwhile, the recess 21 is also formed in a cone shape or a pyramid shaped having a slant surface 21a as a side surface, and an apex thereof is positioned at the center of the placing table 14. The cone shape or the pyramid shape of the protrusion 20 is conformal to that of the recess 21. Moreover, the protrusion 20 and the recess 21 can also be formed in a truncated cone shape or a truncated pyramid shape.

When the dummy wafer 17 is lowered on the placing table by the lifter pins 15, the slant surface 20a of the protrusion 20 is engaged with the slant surface 21a of the recess 21, thereby centering the dummy wafer 17 with respect to the placing table 14. In other words, by inserting the protrusion 20 into the recess 21, the center of the dummy wafer 17 coincides with that of the specific mounting position of the wafer W. Other operations for obtaining the transfer shift of the transfer mechanism (TRM) can be performed by the same processes described in the first embodiment.

Third Embodiment

FIG. 4 presents a cross sectional view of a mechanism for centering a dummy substrate in accordance with a third embodiment of the present invention. In the third embodiment, a dummy wafer (dummy substrate) 17 is a substrate having the same diameter as that of the wafer W. Further, as a first guide G1 for assisting a centering of the dummy wafer 17, a recess 23 is formed on a bottom surface thereof. Meanwhile, as a second guide G2 for assisting the centering of the dummy wafer 17, protrusions 22 to be engaged with the recess 23 of the dummy wafer 17 are formed on top portions of the lifter pins 15 in the processing chamber 2.

The protrusions 22 formed on the top portions of the lifter pins 15 have a cone shape or a pyramid shape having a slant surface 22a as a side surface. Moreover, a plurality of, e.g., three, lifter pins 15 spaced from each other at regular intervals in a circumferential direction are arranged at the same distance from the center of the placing table 14. Meanwhile, the recess 23 is formed in a circular shape having a diameter fitted to the arrangement area of the lifter pins 15 and, also, a circumferential side surface thereof is formed as a slant surface 23a opened downward. Further, the recess 23 is coaxially provided with respect to an outline of the dummy wafer 17. A tilt angle of the slant surfaces 22a of the protrusions 22 is substantially the same as that of the slant surface 23a of the recess 23.

When the dummy wafer 17 is transferred onto the lifter pins 15 from the transfer robot 12 (see FIG. 1), the slant surfaces 22a of the protrusions 22 are engaged with the slant surface 23a of the recess 23, thereby centering the dummy wafer 17 with respect to the placing table 14. In other words, by inserting the protrusions 22 of the lifter pins 15 into the recess 23, the center of the dummy wafer 17 coincides with that of the specific mounting position of the wafer W. Other operations for obtaining the transfer shift of the transfer mechanism (TRM) can be performed by the same processes described in the first embodiment.

Common Features in First to Third Embodiments

In the first to the third embodiment, the dummy wafer 17 whose initial eccentricity and initial eccentric direction are corrected after passing through the orienter 11 is transferred into the processing chamber 2 and then centered with respect to the placing table 14. However, in case the initial eccentricity of the dummy wafer 17 is small, the dummy wafer 17 can be directly transferred into the processing chamber 2 without passing through the orienter 11 and then centered with respect to the placing table 14. In case the dummy substrate (the dummy wafer 17 in the embodiments) is centered by the engagement between the protrusion and the recess, it is possible to form one of the protrusion and the recess on a bottom surface of the dummy substrate and the other on a top surface of the placing table or on top portions of the lifter pins. In such a case, which one of the protrusion and the recess is to be formed on the dummy substrate is determined depending on a configuration of the substrate to be processed or that of the placing table.

INDUSTRIAL APPLICABILITY

In accordance with the method and the semiconductor processing equipment of the present invention for obtaining a transfer shift of a transfer mechanism, the transfer shift of the transfer mechanism can be obtained without opening the processing chamber, thereby enabling to reduce an unnecessary downtime of the equipment.

What is claimed is:

1. A method for detecting a transfer shift of a transfer mechanism in a semiconductor processing equipment by using a dummy substrate different from a substrate to be processed in having a first guide for assisting a centering thereof, the dummy substrate serving as a substitute for the substrate to be processed, the equipment including:
   a processing chamber for performing a processing on the substrate to be processed;
   a placing table provided in the processing chamber, for mounting thereon the substrate to be processed during the processing;
   the transfer mechanism provided at an outside of the processing chamber, for transferring the substrate to be processed on the placing table;
   a detector provided at the outside of the processing chamber, for detecting an eccentricity and an eccentric direction of the substrate to be processed; and
   a second guide for assisting the centering of the dummy substrate, the second guide centering the dummy substrate by being engaged with the first guide with respect to the placing table while the dummy substrate is transferred onto the placing table by the transfer mechanism,
   the method comprising the steps of:
   centering the dummy substrate with respect to the placing table by an engagement between the first and the second guides on or above the placing table;
   receiving and transferring the centered dummy substrate to the detector by using the transfer mechanism; and
   attaining detection values of an eccentricity and an eccentric direction of the dummy substrate by using the detector and then obtaining the transfer shift of the transfer mechanism based on the detection values.

2. The method of claim 1, further comprising, before the step of centering the dummy wafer with respect to the placing table, the steps of:
   transferring the dummy substrate to the detector;
   attaining initial detection values of an initial eccentricity and an initial eccentric direction of the dummy substrate by using the detector; and
   correcting the initial eccentricity and the initial eccentric direction based on the initial detection values when the dummy substrate is transferred from the detector onto or above the placing table.

3. The method of claim 2, wherein the dummy substrate is transferred by the transfer mechanism before being centered with respect to the placing table.

4. The method of claim 1, wherein the first guide has a side periphery of the dummy substrate whose diameter is greater than that of the substrate to be processed, and the second guide has a guide ring whose upper portion is provided with an upwardly widening opening, the guide ring being disposed to surround the placing table.

5. The method of claim 4, wherein a lower portion of the opening of the guide ring is set to have a substantially same diameter as that of the dummy substrate.

6. The method of claim 1, wherein the first guide has a first slant surface, and the second guide has a second slant surface for centering the dummy substrate with respect to the placing table by an engagement with the first slant surface.

7. The method of claim 6, wherein one of the first and the second slant surface is formed of a side surface of a protrusion, and the other is formed of a side surface of a recess.

8. The method of claim 7, wherein one of the protrusion and the recess is formed on a bottom surface of the dummy substrate, and the other is formed on a top surface of the placing table.

9. The method of claim 7, wherein the recess is formed on the bottom surface of the dummy substrate, and the protrusion is formed on a top portion of a lifter pin for assisting a loading/unloading of the substrate to be processed with respect to the placing table.

10. The method of claim 1, wherein the dummy substrate is essentially made of a same material of the substrate to be processed or quartz.

11. A semiconductor processing equipment for detecting a transfer shift of a transfer mechanism by using a dummy substrate different from a substrate to be processed in having a first guide for assisting a centering thereof, the dummy substrate serving as a substitute for the substrate to be processed, the equipment comprising:
- a processing chamber for performing a processing on the substrate to be processed;
- a placing table provided in the processing chamber, for mounting thereon the substrate to be processed during the processing;
- the transfer mechanism provided at an outside of the processing chamber, for transferring the substrate to be processed on the placing table;
- a detector provided at the outside of the processing chamber, for detecting an eccentricity and an eccentric direction of the substrate to be processed;
- a second guide for assisting the centering of the dummy substrate, the second guide centering the dummy substrate with respect to the placing table by being engaged with the first guide while the dummy substrate is transferred onto the placing table by the transfer mechanism; and
- a control unit for controlling an operation of the equipment, wherein the control unit performs the steps of:
  centering the dummy substrate with respect to the placing table by an engagement between the first and the second guides on or above the placing table;
  receiving and transferring the centered dummy substrate to the detector by using the transfer mechanism; and
  attaining detection values of an eccentricity and an eccentric direction of the dummy substrate by using the detector and then obtaining the transfer shift of the transfer mechanism based on the detection values.

12. The equipment of claim 11, wherein the control unit further performs, before the step of centering the dummy wafer with respect to the placing table, the steps of:
  transferring the dummy substrate to the detector;
  attaining initial detection values of an initial eccentricity and an initial eccentric direction of the dummy substrate by using the detector; and
  correcting the initial eccentricity and the initial eccentric direction based on the initial detection values when the dummy substrate is transferred from the detector onto or above the placing table.

13. The equipment of claim 12, wherein control unit controls the transfer mechanism to transfer the dummy wafer that has not yet been centered with respect to the placing table.

14. The equipment of claim 11, wherein the first guide has a side periphery of the dummy substrate whose diameter is greater than that of the substrate to be processed, and wherein the second guide has a guide ring whose upper portion is provided with an upwardly widening opening, the guide ring being disposed to surround the placing table.

15. The equipment of claim 14, wherein a lower portion of the opening of the guide ring is set to have a substantially same diameter as that of the dummy substrate.

16. The equipment of claim 11, wherein the first guide has a first slant surface, and the second guide has a second slant surface for centering the dummy substrate with respect to the placing table by an engagement with the first slant surface.

17. The equipment of claim 16, wherein one of the first and the second slant surface is formed of a side surface of a protrusion, and the other is formed of a side surface of a recess.

18. The equipment of claim 17, wherein one of the protrusion and the recess is formed on a bottom surface of the dummy substrate, and the other is formed on a top surface of the placing table.

19. The equipment of claim 17, wherein the recess is formed on the bottom surface of the dummy substrate, and the protrusion is formed on a top portion of a lifter pin for assisting a loading/unloading of the substrate to be processed with respect to the placing table.

20. The equipment of claim 11, wherein the control unit controls an operation of the transfer mechanism so that the obtained transfer shift can be corrected.

* * * * *